(12) United States Patent
Tohsche

(10) Patent No.: US 7,049,871 B2
(45) Date of Patent: May 23, 2006

(54) D-TYPE FLIP-FLOP WITH A REDUCED NUMBER OF TRANSISTORS

(75) Inventor: Ulf Tohsche, München (DE)

(73) Assignee: Infineon Technologies AG, Munich (DE)

( * ) Notice: Subject to any disclaimer, the term of this patent is extended or adjusted under 35 U.S.C. 154(b) by 73 days.

(21) Appl. No.: 10/699,135

(22) Filed: Oct. 31, 2003

(65) Prior Publication Data

US 2004/0130370 A1   Jul. 8, 2004

(30) Foreign Application Priority Data

Oct. 31, 2002   (DE) ............................... 102 50 869

(51) Int. Cl.
   *H03K 3/02*   (2006.01)
(52) U.S. Cl. ....................... 327/197; 327/202; 327/203
(58) Field of Classification Search ................ 327/202, 327/203, 206, 208, 218, 115, 197
   See application file for complete search history.

(56) References Cited

U.S. PATENT DOCUMENTS

| | | | |
|---|---|---|---|
| 6,232,810 B1 * | 5/2001 | Oklobdzija et al. ......... | 327/217 |
| 6,445,217 B1 * | 9/2002 | Kojima et al. ................ | 327/57 |
| 6,720,813 B1 * | 4/2004 | Yee et al. .................... | 327/218 |
| 2003/0006812 A1 * | 1/2003 | Collier et al. ................ | 327/115 |

FOREIGN PATENT DOCUMENTS

| | | | |
|---|---|---|---|
| JP | SHO 60-224319 | * | 11/1985 |
| JP | 10093397 A | | 4/1998 |

* cited by examiner

*Primary Examiner*—Tuan T. Lam
*Assistant Examiner*—Hiep Nguyen
(74) *Attorney, Agent, or Firm*—Laurence A. Greenberg; Werner H. Stemer; Ralph E. Locher

(57) ABSTRACT

A flip-flop includes a clock signal input, a data signal input, non-inverting and inverting outputs, a data acceptance unit, and a storage unit having a feedback loop with first and second inverter circuits having feedback to one another. The inverting output is coupled to the first inverter circuit output and the non-inverting output is coupled to the second inverter circuit output. The acceptance unit, dependent upon the data and clock signals present, allocates a programming potential to the first or the second inverter circuit input and applies no potential to the respective other input of the circuits. The acceptance unit has a first switching element applying the predetermined programming potential to the input of the first inverter circuit dependent upon the clock and data signals and a second switching element applying the predetermined programming potential to the second inverter circuit input dependent upon the clock and data signals.

15 Claims, 2 Drawing Sheets

D-TYPE FLIP-FLOP WITH A REDUCED NUMBER OF TRANSISTORS

BACKGROUND OF THE INVENTION

Figure 1:
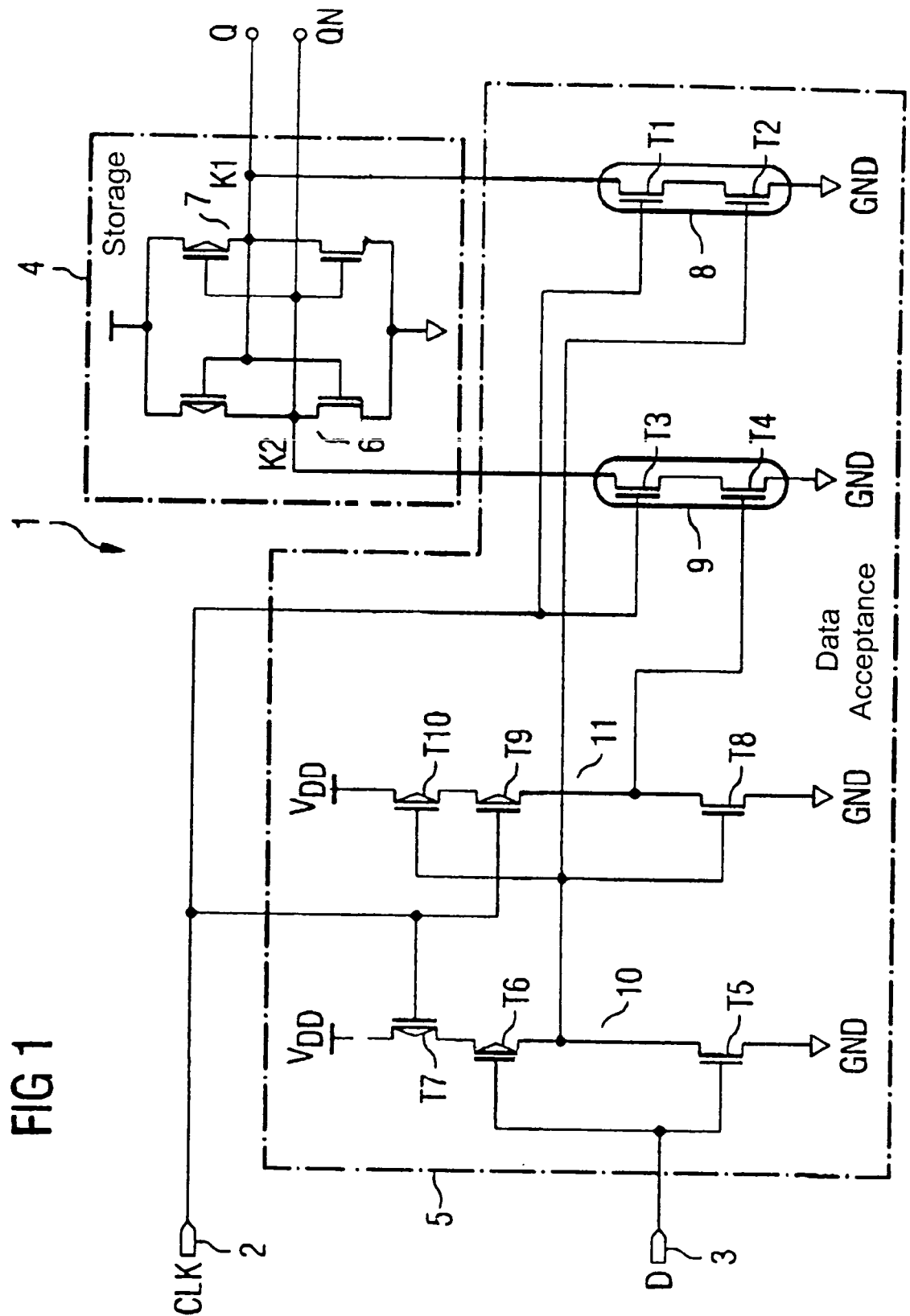

The invention relates to a D-type flip-flop and to a D-type flip-flop with an activation input.

In integrated circuits having a large number of flip-flop circuits, the required chip area is determined to a significant extent by the area of the flip-flops. In the circuit to be integrated, a large number of required flip-flops lead to a very large chip area or have the effect that it is not possible for the entire circuit to be integrated in a chip.

The flip-flop circuits are, usually, constructed from a master latch and a slave latch, the master latch accepting a data signal present at the data input with a first edge and the slave latch accepting the data signal with a second edge, from where it can, then, be tapped off at a non-inverting and an inverting output. For such a purpose, in each D-type flip-flop, an inverted clock signal can be formed from the clock signal present by an inverter circuit and a non-inverted clock signal can be formed from the inverted clock signal by a further inverter circuit so that the non-inverted clock signal and the inverted clock signal can be made available to the master latch and to the slave latch.

Usually, both master latch and the slave latch comprise a clock-level-controlled holding element into which data are accepted with the aid of the first and the second clock edge, respectively, and are stored permanently, i.e., statically, therein depending on the clock level. Making the non-inverted clock signal and the inverted clock signal available for the master latch and the slave latch means that at least two or four transistors are required, which increase the area required in the integrated circuit.

SUMMARY OF THE INVENTION

This object is achieved by means of the flip-flop according to claim 1.

Further advantageous refinements of the invention are specified in the dependent claims.

The invention provides a flip-flop having a clock input for the application of a clock signal, a data input for the application of a data signal, a non-inverting output and an inverting output. The flip-flop has a data acceptance unit and a storage unit. The storage unit essentially comprises a feedback loop with a first and a second inverter circuit having feedback to one another (SRAM cell0. The non-inverting output is coupled to an output of the first inverter circuit and the inverting output is coupled to an output of the second inverter circuit. The data acceptance unit is configured in such a way as, depending on the data signal present and the clock signal present, to allocate a predetermined programming potential either to an input of the first inverter circuit or to an input of the second inverter circuit and to apply no potential to the input of the respective other of the first and second inverter circuits. The data acceptance device has a first switching element in order to apply the predetermined programming potential to the input of the first inverter circuit depending on the clock signal and the data signal. The data acceptance device furthermore has a second switching element in order to apply the predetermined programming potential to the input of the second inverter circuit depending on the clock signal and the data signal.

The flip-flop circuit according to the invention has the advantage that it manges with a smallar number of transistors and that separate switching elements are used by virtue of the provision of a first and a second switching element for switching the programming potential. This has the advantage that no interactions can occur between the input of the first inverter circuit and the input of the second inverter circuit.

It may be provided that the first switching element is connected up in such a way that it is activated in the event of a first level of the lcock signal and a first level of the data signal and is inhibited in the event of a second level of the clock signal and/or a second level of the data signal. The second switching element may be connected up in such a way that it is activated in the event of a first level of the clock signal and a second level of the data signal and is inhibited in the event of a second level of the clock signal and/or a first level of the data signal. In this way, the programming potential is applied to the input of the first inverter circuit if a first level of the data signal and a first level of the clock signal are present and the programming potential is applied to the input of the second inverter circuit if the second level of the data signal and the first level of the clock signal are present. Through application of the programming potential to the respective node of the feedback loop, the storage unit is programmed, i.e. a potential is impressed which corresponds to the input for the application of a data signal, a non-inverting output, and an inverting output. The flip-flop has a data acceptance unit and a storage unit. The storage unit substantially includes a feedback loop with a first and a second inverter circuit having feedback to one another (SRAM cell). The non-inverting output is coupled to an output of the first inverter circuit and the inverting output is coupled to an output of the second inverter circuit. The data acceptance unit is configured, depending on the data signal present and the clock signal present, to allocate a predetermined programming potential either to an input of the first inverter circuit or to an input of the second inverter circuit and to apply no potential to the input of the respective other of the first and second inverter circuits. The data acceptance device has a first switching element to apply the predetermined programming potential to the input of the first inverter circuit depending on the clock signal and the data signal. The data acceptance device, furthermore, has a second switching element to apply the predetermined programming potential to the input of the second inverter circuit depending on the clock signal and the data signal.

The flip-flop circuit according to the invention has the advantage that it manages with a smaller number of transistors and that separate switching elements are used by virtue of the provision of a first and a second switching element for information to be stored and is held by the feedback of the feedback loop.

It may furthermore be provided that the first switching element is coupled to an output of a first partially clocked inverter in order to apply the inverted data signal to the first switching element in the event of a second level of the clock signal or in the event of the first level of the clock signal given the presence of the second level of the data signal and to apply no potential actively to the corresponding node of the first switching element given the presence of the first level of the clock signal and the first level of the data signal.

It may furthermore be provided that the second seitching element is coupled to an output of a second partially clocked inverter, the second partially clocked inverter being connected to the output of the first partially clocked inverter in order to apply a non-inverted data signal to the second switching element in the event of a second level of the clock signal and to apply no potential actively to the second switching element in the event of a first level of the clock signal.

In this way, the driving of the first and second switching elements can be carried out by the first and second partially clocked inverters. As a result, the switching elements can be driven with comparatively few transistors. In contrast to customary circuits in which partially clocked inverters comprise four series-connected transistors, two of which have to be driven with an inverted clock signal and a non-inverted clock signal, the first and second partially clocked inverters which are used in the invention have only three series-connect transistors, only one of the transistors being driven by the non-inverted clock signal. In this way it is possible to avoid the situation in which an inverted clock signal has to be made available within the flip-flop circuit.

It is preferably provided that the first and second partially clocked inverters are configured in such a way that, in the event of a change in the clock signal from a second level to the first level given an unchanged data signal, the inverted data signal is present at the output of the first partially clocked inverter and consequently the non-inverted data signal is present at the output of the second partially clocked inverter in any case until the data signal is stored in the storage unit.

In accordance with a further aspect of the present invention, an activation input is provided in order to activate or deactivate the flip-flop with the aid of an activation signal. In this case, the first switching element and the second switching element are activated or inhibited in each case depending on the clock signal, the data signal present at the data input, and the activation signal, so that, in the event of a deactivated activation signal, the information of the storage element remains stored independently of the clock signal present and the data signal present. In this way, it is possible to realize a D-type flip-flop with an activation input in which the activation input can be implemented in a simple way and in which case the implementation of the activation input requires a smaller number of transistors than in previous D-type filp-flops. Furthermore, existing layouts have to be changed only to an insignificant extent since the storage element and also the first and second switching elements can be retained essentially unchanged.

It may furthermore be provided that the first switching element is coupled to an output of a first partially clocked gate in order to apply the inverted data signal to the first switching element in the event of an activated activation signal and in the event of a second level of the clock signal, to apply on potential to the first switching element in the event of a deactivated activation signal, and in the event of the first level of the clock signal and an activated activation signal, to apply either the inverted data signal to the first switching element if the second level of the data signal is present, or no potential to the first switching element if the first level of the data signal is present. In this way it is possible to make available to the first and second switching elements drive signals which depend on the data signal present, the clock signal and the activation signal, and the driving being effected with the aid of a first and second partially clocked gate. In this way, the activation input can be realized with a very small number of transistors.

It may be provided that the second switching element is coupled to an output of a second partially clocked gate, the second partially clocked gate being connected to the output of the first partially clocked gate in order to apply a non-inverted data signal to the second switching element in the event of an activated activation signal and in the event of a second level of the clock signal, and to apply no potential to the second switching element in the event of the first level of the clock signal and/or in the event of a deactivated activation signal.

Preferably, the first or the second switching element is connected to the first and the second partially clocked gate such that, in the event of a deactivated activation signal and in the event of the first level of the clock signal depending on the data signal stored in the storage unit, the first or the second switching element is activated in order to retain the information stored in the storage unit. For this purpose, the outputs of the first inverter circuit and of the second inverter circuit may be fed back to the data acceptance unit and be connected up there in such a way that, in the event of a deactivated activation signal, precisely one of the first and second switching elements is activated, so that a programming potential is applied to the input of the first or the input of the second inverter circuit. This ensures that that node of the feedback unit which is at the programming potential is reliably held at the programming potential. In other words, the potential at the output of the feedback inverter circuits which is at a potential which corresponds to the inverted information of the programming potential is intended not to be able to be inadvertently connected to the programming potential by the corresponding switching element. This could be effected, in the event of a deactivated activation signal, e.g. through floating of the control signals present at the switching elements.

Figure 2:
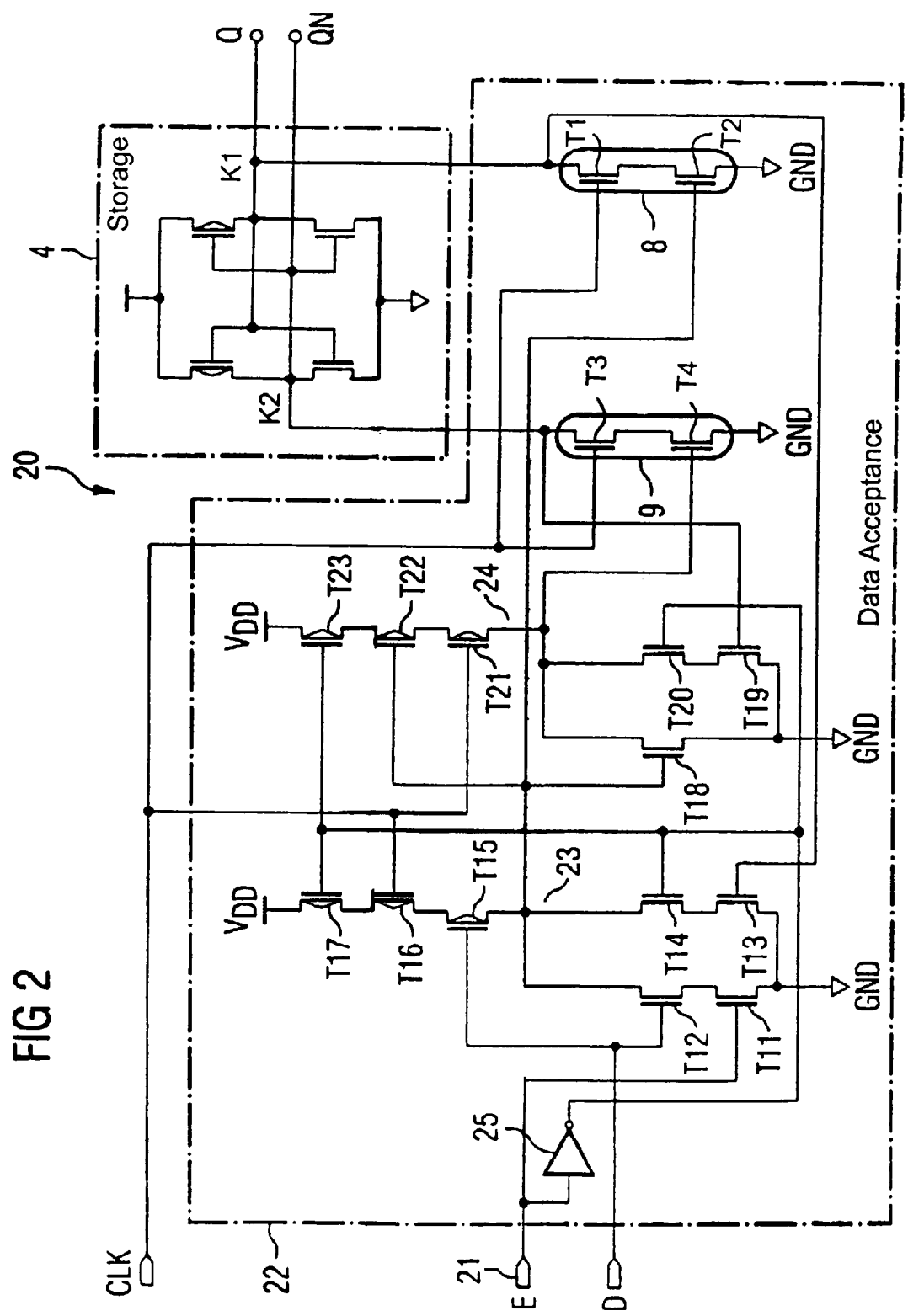

Preferred embodiments of the invention are explained in more detail below with reference to the accompanying drawings, in which:

FIG. 1 shows a D-type flip-flop circuit in accordance with a first embodiment of the invention; and FIG. 2 shows a D-type flip-flop circuit with an activation input in accordance with a second embodiment of the invention.

FIG. 1 shows a D-type flip-flop 1 having a clock input 2 for the clock signal CLK. The D-type flip-flop 1 furthermore has a data input 3 a data signal D. The D-type flip-flop circuit 1 has a storage element 4 and a data acceptance circuit 5.

The storage element 4 essentially comprises two inverter circuits having feedback to one another, a first inverter circuit 6 and a second inverter circuit 7, the first and second inverter circuits in each case comprising a P-channel transistor and an N-channel transistor connected in series. An input of the respective inverter circuit is situated at the control terminals of the transistors, which control terminals are to be contact-connected jointly. An output of the respective inverter circuit 6, 7 can be tapped off at the interconnected terminals of the P-channel transistor and N-channel transistor. Furthermore, an operating voltage is present across the transistors.

The first and second inverter circuits 6, 7 have feedback to one another, i.e. the output of the first inverter circuit 6 is connected to the input of the second inverter circuit 7 at a second node K2, and the output of the second inverter circuit 7 is connected to the input of the first inverter circuit 6 at a first node K1. The stored non-inverted data signal can be tapped off at the output of the first inverter circuit 6 and the stored inverted data signal can be tapped off at the output of the second inverter circuit 7.

The information to be stored is written to the storage element 4 by means of a first switching device 8 and a second switching device 9.

The first switching device 8 has a first transistor T1 and a second transistor T2, which are connected in series. A control input of the first transistor T1 is connected to the clock input 2. A control input of the second transistor T2 is connected to an output of a first partially clocked inverter 10. The data signal D is present at the input of the first partially clocked inverter via the data input 3. The first switching element 8 is connected to a programming potential, preferably a ground potential, in order, in the event of activation of the first transistor T1 and of the second transistor T2, to apply the ground potential to the first node K1, i.e. to the input of the first inverter circuit 6.

The second switching element 9 has a third transistor T3 and a fourth transistor T4. The third transistor T3 and the fourth transistor T4 are connected in series, so that, in the event of activation of the third and fourth Transistors T3, T4, the programming potential or the ground potential is applied to the second node K2, i.e. to the input of the second inverter circuit 7. The control terminal of the third transistor T3 is connected to the clock input 2 for the application of the clock signal CLK. A control input of the fourth transistor T4 is connected to the output of a second partially clocked inverter. The first, second, third and fourth transistors T1, T2, T3, T4 are preferably designed as N-channel transistors.

The first partially clocked inverter 10 has a fifth N-channel transistor T5, a sixth P-channel transistor T6 and a seventh P-channel transistor T7. A first terminal of the seventh P-channel trnasistor T7 is connected to a high supply voltage potential $V_{pp}$. A second terminal of the seventh P-channel transistor T7 is connected to a first terminal of the sixth P-channel transistor T6 and a second terminal of the sixth P-channel transistor T6 is connected to a first terminal of the fifth N-channel transistor T5. A second terminal of the fifth N-channel transistor T5 is connected to the ground potential GND. The first terminal of the fifth N-channel transistor T5 and the second terminal of the sixth P-channel transistor T6 are connected to the control terminal of the second transistor T2 of the first switching element 8. Control terminals of the fifth N-channel transistor T5 and of the sixth P-channel transistor T6 are connected to the data input 3 in order to apply the data signal. The clock signal CLK is applied to a control terminal of the seventh P-channel transistor T7.

The second partially clocked inverter 11 has an eighth N-channel transistor T8, a ninth P-channel transistor T9 and a tenth P-channel transistor T10. A first terminal of the tenth P-channel transistor T10 is connected to the high supply voltage potential $V_{pp}$ and a second terminal of the tenth P-channel transistor T10 is connected to a first terminal of the ninth P-channel transistor T9. A second terminal of the ninth P-channel transistor T9 is connected to a first terminal of the eighth N-channel transistor T8 and a second terminal of the eighth N-channel transistor T8 is connected to the ground potential GND. Control inputs of the tenth P-channel transistor T10 and of the eighth N-channel transistor T8 are connected to the output of the first partially clocked inverter 10, i.e. to the second terminal of the sixth P-channel transistor T6 and the first terminal of the fifth N-channel transistor T5. The clock signal CLK is applied to the control terminal of the ninth P-channel transistor T9.

The series-connected transistors can be arbitrarily interchanged without adversely affecting the function of the circuit.

The flip-flop circuit 1 described above is able to accept a data signal at the data input 3 into the data acceptance unit 5 in the event of a low level of the clock signal CLK and to write it to the storage element 4 in the event of a high level of the clock signal CLK. The process of writing to the storage element 4 is effected via the first switching element 8 and the second switching element 9, only one of the two switching elements 8, 9 being activated, while the respective other switching element is inhibited and, consequently, no potential is applied to the node K1, K2 of the feedback loop which is present at the switching element. The node K1, K2 of the feedback loop which is connected to the activated switching element 8, 9 is pulled to a low level corresponding to the ground potential GND and is inverted by the corresponding inverter circuit 6, 7, so that a high level is present at the respective other node K1, K2 of the feedback loop. The two nodes, K1, K2 of the feedback loop of the storage element 4 are available as outputs of the flip-flop Q, QN, the first node K1 corresponding to the non-inverted output Q and the second node K2 corresponding to the inverted output QN.

The two switching elements 8, 9 serve for setting the storage element and are controlled by a semi-stable dynamic latch. This latch has the advantage that it can essentially be contructed with a smaller number of transistors than a static latch in a conventional D-type flip-flop.

By means of two partially clocked inverters, which are clocked only in the pull-up path, i.e. by the seventh P-channel transistor T7 and by the ninth P-channel transistor T9 with the aid of the clock signal CLK, the complementary input levels are generated, from the data signal D, at the first node K1 and the second node K2 of the storage element 4. In the event of a low clock level of the clock signal CLK, the first and second partially clocked inverter circuits 10, 11 are activated, so that the seventh and ninth P-channel transistors T7, T9 are activated in order to operate the first and second partially clocked inverters as inverters. In the event of a high clock level, the partially clocked inverters 10, 11 do not represent inverting gates, so that essentially no drive signal driven through from the data input from the low level to the high level is forwarded to the first and the second switching element 8, 9.

However, the first clock-controlled inverter 10 is not completely inhibited because a rising edge, i.e. a high signal level at the data input 3, can cause the output of the first clock-controlled inverter 10 to be pulled from a HIGH level to a low level. This level change could affect the output of the D-type flip-flop only if the hold time of the circuit were not properly complied with, since the path which is to be kept open for a minimum duration and is connected to the node K1 would then be closed prematurely in the driving of the storage element 4. The hold time is not complied with when the signal to be written, which is intended to be impressed on the feedback loop, is present at one of the nodes of the storage unit 4 only for an excessively short time duration.

In order to rewrite the information stored in the storage element 4 on account of a signal change—taking place during a high clock level—at the data input 3 from a low to a high potential, the second switching element 9 would have to be activated. This can only take place if the second partially clocked inverter 11 outputs a high signal level at its output in order to activate the fourth N-channel transistor T4 of the second switching element 9. This is not possible, however, since, by virtue of the ninth P-channel transistor T9 being off, the output of the second partially clocked inverter 11 cannot assume a high potential if switching delays occur.

The provision of mutually separate switching elements 8, 9 has the advantage that the notes K1, K2 of the feedback loop cannot be short-circuited to one another if switching delays occur.

The flip-flop described above has the further advantage that it has a significantly reduced area requirement compared with the D-type flip-flops used heretofore. Furthermore, the D-type flip-flop circuit presented has good layout properties since, in particular, few line crossovers are present. Moreover, the circuit proposed requires a smaller number of P-channel transistors, which usually have a greater influence on the circuit area than N-channel transistors.

The outputs of the D-type flip-flop can be tapped off at the two nodes K1, K2 of the storage unit 4. In order that the feedback loop comprising the inverters 6 and 7 is not influenced by large input loads, provision is preferably made for decoupling the outputs from the downstream circuit via buffers (not shown).

In FIG. 2 provision is made of a further D-type flip-flop 20 with an activation in put 21, to which an activation signal E can be applied. The further D-type flip-flop 20 has a storage element 4, a first switching element 8 and a second switching element 9, which are identical to the storage element 4 and the switching elements 8, 9 of the embodiments according to FIG. 1. Identical reference symbols indicate indentical elements with an identical function.

In a further data acceptance unit 22, internal drive signals for the first and second switching elements 8, 9 are made available with the aid of a first partially clocked gate 23 and a second partially clocked gate 24.

The first partially clocked gate 23 has an eleventh N-channel transistor T11 and a twelfth N-channel transistor T12 connected in series therewith. A first terminal of the eleventh N-channel transistor T11 is connected to the ground potential GND. A second terminal of the eleventh N-channel transistor T11 is connected to a first terminal of the twelfth N-channel transistor T12 and a second terminal of the twelfth N-channel transistor T12 is connected to the seoncd N-channel transistor T2 of the first switching element 8.

The first partially clocked gate 23 furthermore has a thirteenth N-channel transistor T13 and a fourteenth N-channel transistor T14 connected in series therewith. A first terminal of the thirteenth N-channel transistor T13 is connected to the ground potential GND and a second terminal of the thirteenth N-channel transistor T13 is connected to a first terminal of the fourteenth N-channel transistor T14. A second terminal of the fourteenth N-channel transistor T14 is likewise connected to the control terminal of the second N-channel transistor T2 of the first switching element 8.

The data signal D is applied to a control input of the twelfth N-channel transistor T12. The activation signal E is applied to a control input of the eleventh N-channel transistor T11.

A transistor chain having a fifteenth P-channel transistor T15, a sixteenth P-channel transistor T16 and a seventeenth P-channel transistor T17 is connected to the second terminals of the twelfth and fourteenth N-channel transistors T12, T14. A first terminal of the fifteenth P-channel transistor is connected to the second terminals of the twelfth and fourteenth N-channel transistors T12, T14. A first terminal of the sixteenth P-channel transistor T16 is connected to a second terminal of the fifteenth P-channel transistor T15 and a first terminal of the seventeenth P-channel transistor T17 is connected to a second terminal of the sixteenth P-channel transistor T16. A second terminal of the seventeenth P-channel transistor T17 is connected to the high supply voltage potential $V_{pp}$.

A control terminal of the thirteenth N-channel transistor T13 is connected to the first node K1, i.e. the inverting output of the further D-type flip-flop 20, i.e. to the first terminal of the first N-channel transistor T1 of the first switching element 8. A control terminal of the fourteenth N-channel transistor T14 is connected, in the same way as a control terminal of the seventeenth P-channel transistor T17, to the activation signal E inverted via an inverter 25. The data signal D is applied to a control terminal of the fifteenth P-channel transistor T15. The clock signal CLK is applied to a control terminal of the sixteenth P-channel transistor T16.

The second partially clocked gate 24 has an eighteenth N-channel transistor T18, the first terminal of which is connected to the ground potential GNB and the second terminal of which is connected to the control terminal of the fourth N-channel transistor T4 of the second switching element 9. A first terminal of a nineteenth N-channel transistor T9 is likewise connected to the ground potential GND and a second treminal of the nineteenth N-channel transistor T19 is connected to a first terminal of a twentieth N-channel transistor T20. A second terminal of the twentieth N-channel transistor T20 is connected, in the same way as the second terminal of the eighteenth N-channel transistor T18, to the control terminal of the fourth N-channel transistor T4 of the second switching element 9. The second partially clocked gate 24 furthermore has a twenty-first P-channel transistor T21, the first terminal of which is connected to the second terminals of the eighteenth and twentieth N-channel transistors T18, T20. A second terminal of the twenty-first P-channel transistor T21 is connected to a first terminal of a twenty-second P-channel transistor T22. A first terminal of a twenty-third P-channel transistor T23 is connected to a second terminal of the twenty-second P-channel transistor T22. A second terminal of the twenty-third P-channel transistor T23 is connected to the high supply voltage potential $V_{pp}$.

A control terminal of the twenty-first P-channel transistor T21 is connected to the clock signal CLK. The output of the first partially clocked gate 23, i.e. the second terminals of the twelfth and fourteenth N-channel transistors T12 and T14, is connected to the control terminals of the eighteenth N-channel transistor T18 and of the twenty-second P-channel transistor T22. The inverted activation signal E is applied to the control terminals of the twenty-third P-channel transistor T23 and of the twentieth N-channel transistor T20. The inverted output QN of the further D-type flip-flop 20, i.e. the second node K2, is connected to a control input of the nineteenth N-channel transistor T19.

The function of activation or deactivation of the further D-type flip-flop 20 is essentially effected by the seventeenth P-channel transistor T17 and the twenty-third P-channel transistor T23. These transistors turn off in the event of a low level of the activation signal E, which indicates that the further D-type flip-flop 20 is to be deactivated. Since, by virtue of the turning off of the seventeenth and twenty-third P-channel transistors T17, T23 in the event of a low level of the activation signal E, the drive signals for the first and second switching elements 8, 9 can no longer assume a high level, in the event of a deactivated activation signal none of the nodes K1, K2 of the storage unit 4 can be pulled by the activation of the respective switching element 8, 9 from a high level to a low level and thus effect toggling of the information stored in the storage element 4.

In order that, in the event of a deactivated activation signal E, the floating control terminals of the second N-channel transistor of the first switching element 8 and of the fourth N-channel transistor T4 of the second switching element 9 cannot pass from a low level to the high level, e.g. due to leakage currents, the eleventh N-channel transistor T11, the thirteenth N-channel transistor T13, the fourteenth N-channel transistor T14 and also the nineteenth and twentieth N-channel transistors T19, are introduced in comparison with the D-type flip-flop 1 in accordance with the first embodiment. These transistors have the effect of switching the drive signal for the first and, respectively, the second switching element 8, 9 in the event of a deactivated activation signal in such a way that the ground potential GND is applied to the input of the first or second inverter circuit 6, 7 which is at a low level for the purpose of storing the data signal.

A low level of the activation signal indicates that the D-type flip-flop 20 is to be deactivated. In this case, the fourteenth N-channel transistor T14 and the twentieth N-channel transistor T20 attain the on state, so that it now depends on the datum stored in the storage element 4 whether the thirteenth N-channel transistor T13 or the nineteenth N-channel transistor T19 is activated. I the second node K2 is at a high potential, then the nineteenth N-channel transistor T19 is activated, so that a low potential is reliably present at the control input of the fourth N-channel transistor T4, so that the second node K2 is not connected to the ground potential GND. This safeguards the stored information in the storage unit 4 in the event of a deactivated activation signal E.

The D-type flip-flop circuits according to the invention enable direct processing of the clock signal without inverters between clock input and clocking transistors. The data acceptance unit 22 is thus clock with the rising edge of the clock signal CLK. Conventional flip-flop circuits have two latches which are generally triggered on complementary clock edges. By virtue of the fact that the inverters between clock input and clocking transistors can be avoided in the case of the D-type flip-flop circuit according ot the invention, it is possible to reduce the number of transistors required for a D-type flip-flop circuit and to considerably reduce the internal power loss particularly in the case of a large number of D-type flip-flops used.

I claim:

1. A flip-flop, comprising:
   a clock input for the application of a clock signal;
   a data input for the application of a data signal;
   a non-inverted output;
   an inverted output;
   a data acceptance unit having a first switching element and a second switching element;
   a storage unit having first and second inverter circuits connected in a feedback loop to provide feedback between said first and second inverter circuits;
   an activation input to activate the flip-flop with an activation signal, said first switching element and said second switching element being activated or inhibited, respectively, dependent upon the clock signal, the data signal present at said data input, and the activation signal, causing information of said storage unit to remain stored independently of the clock signal present and the data signal present, in an event of a deactivated activation signal;
   said first inverter circuit having:
      a first input; and
      a first output coupled to said inverted output;
   said second inverter circuit having:
      a second input; and
      a second output coupled to said non-inverted output; and
   said data acceptance unit allocating, dependent upon the data signal present and the clodk signal present, a predetermined programming potential either to said first input or to said second input and to apply no potential to the respective other input of said first and second inverter circuits, said first switching element of said data acceptance unit applying said predetermined programming potential to said first input dependent upon the clock signal and the data signal, and said second switching element of said data acceptance unit applying said predetermine programming potential to said second input dependent upon the clock signal and the data signal.

2. The flip-flop according to claim 1, wherein said first switching element is activated in an event of a first level of the clock signal and a first level of the data signal and is inhibited in an event of at least one of a second level of the clock signal and a second level of the data signal.

3. The flip-flop according to claim 2, wherein said second switching element is activated in the event of the first level of the clock signal and the second level of the data signal and is inhibited in the event of at least one of the second level of the clock signal and the first level of the data signal.

4. The flip-flop according to claim 1, wherein said second switching element is activated in an event of a first level of the clock signal and a second level of the data signal and is inhibited in an event of at least one of a second level of the clock signal and a first level of the data signal.

5. The flip-flop according to claim 3, wherein:
   said data acceptance unit has a first partially clocked inverter with an output; and
   said first switching element is coupled to said output of said first partially clocked inverter to apply an inverted data signal to said first switching element in the event of one of the second level of the clock signal and the first level of the clock signal given a presence of the second level of the data signal is and to apply no potential to said first switching element given a presence of the first level of the clock signal and the first level of the data signal are present.

6. The flip-flop according to claim 1, wherein:
   said data acceptance unit has a first partially clocked inverter with an output; and
   said first switching element is coupled to said output of said first partially clocked inverter to apply an inverted data signal to said first switching element in the event of one of a second level of the clock signal and a first level of the clock signal given a presence of a second level of the data signal and to apply no potential to said first switching element when of the first level of the clock signal and a first level of the data signal are present.

7. The flip-flop according to claim 6, wherein:
   said data acceptance unit has a second partially clocked inverter with an output; and
   said second switching element is coupled to said output of said second partially clocked inverter and said second partially clocked inverter is connected to said output of said first partially clocked inverter to apply a non-inverted data signal to said second switching element in the event of the second level of the clock signal and to not change the potential to said second switching element in the event of the first level of the clock signal.

8. The flip-flop according to claim 5, wherein:
   said data acceptance unit has a second partially clocked inverter with an output; and
   said second switching element is coupled to said output of said second partially clocked inverter and said second partially clocked inverter is connected to said output of said first partially clocked inverter to apply a non-inverted data signal to said second switching element in the event of the second level of the clock signal and to not change the potential to said second switching element in the event of the first level of the clock signal.

9. The flip-flop according to claim 7, wherein said first and second partially clocked inverters are configured, in an event of a change in the clock signal from the second level to the first level when the data signal is unchanged, to present the inverted data signal at said output of said first partially clocked inverter and to present the non-inverted data signal at said output of said second partially clocked inverter until the data signal is stored in said storage unit.

10. The flip-flop according to claim 8, wherein said first and second partially clocked inverters are configured, in an event of a change in the clock signal from the second level to the first level given an unchanged data signal, to present the inverted data signal at said output of said first partially clocked inverter and to present the non-inverted data signal at said output of said second partially clocked inverter until the data signal is stored in said storage unit.

11. The flip-flop according to claim 1, wherein:
said data acceptance unit has a first partially clocked gate with an output;
said first switching element is coupled to said output of said first partially clocked gate;
  to apply an inverted data signal to said first switching element in an event of an activated activation signal and in an event of a second level of the clock signal;
  to apply a ground potential to said first switching element in an event of a deactivated activation signal; and in an event of a first level of the clock signal, to apply either:
    the inverted data signal to said first switching element if a second level of the data signal is present; or
    no potential to said first switching element if a first level of the data signal is present.

12. The flip-flop according to claim 11, wherein:
said data acceptance unit has a first partially clocked gate with an output;
said second switching element is coupled to said output of said second partially clocked gate;
said second partially clocked gate is connected to said output of said first partially clocked gate;
  to apply a non-inverted data signal to said second switching element in an event of an activated activation signal and in an event of a second level of the clock signal; and
to apply a ground potential to said second switching element at least one in an event of the first level of the clock signal and in an event of a deactivated activation signal.

13. The flip-flop according to claim 12, wherein one of said first and said second switching elements is connected to said first and said second partially clocked gates to activate, in the event of the deactivated activation signal and in the event of the first level of the clock signal, dependent upon the data signal stored in said storage unit, one of said first and said second switching element to retain information stored in said storage unit.

14. The flip-flop according to claim 12, wherein at least one of said first and said second switching elements is connected to at least one of said first and said second partially clocked gates to activate, in the event of the deactivated activation signal and in the event of the first level of the clock signal, dependent upon the data signal stored in said storage unit, one of said first and said second switching element to retain information stored in said storage unit.

15. The flip-flop comprising:
a clock input for the application of a clock signal;
a data input for the application of a data signal;
a non-inverted output;
an inverted output;
a data acceptance unit having a first switching element and a second switching element;
a storage unit having first and second inverter circuits connected in a feedback loop;
an activation input to activate the flip-flop with an activation signal, said first switching element and said second switching element being activated or inhibited, respectively, dependent upon the clock signal, the data signal present at said data input, and the activation signal, causing information of said storage unit to remain stored independently of the clock signal present and the data signal present, in an event of a deactivated activation signal;
said first inverter circuit having:
  a first input; and
  a first output coupled to said inverted output; said second inverter circuit having:
  a second input; and
  a second output coupled to said non-inverted output; and
said data acceptance unit allocating, dependent upon the data signal present and the clock signal present, a predetermined programming portential either to said first input or to said second input and to apply no potential to the respective other input of said first and second inverter circuits, said first switching element respectively applying said predetermined programming potential to said first input, and said second switching element respectively applying said predetermined programming potential to said second input.

* * * * *